(12) United States Patent
Park

(10) Patent No.: US 6,268,243 B1
(45) Date of Patent: Jul. 31, 2001

(54) METHOD FOR FABRICATING DYNAMIC RANDOM ACCESS MEMORY CELLS

(75) Inventor: Syung-Hyun Park, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/413,037

(22) Filed: Oct. 6, 1999

(30) Foreign Application Priority Data

Apr. 15, 1999 (KR) .................................................. 99-13369

(51) Int. Cl.[7] .................................................. H01L 21/8242
(52) U.S. Cl. .............................................. 438/239; 438/241
(58) Field of Search .................................. 438/239–256, 438/381–399

(56) References Cited

U.S. PATENT DOCUMENTS 5,666,002 * 9/1997 Yamamoto et al. .................. 257/621
5,879,980 * 3/1999 Selcuk et al. ........................ 438/238

* cited by examiner

*Primary Examiner*—David Nelms
*Assistant Examiner*—David Vu

(57) ABSTRACT

A method for fabricating DRAM cells according to the present invention includes the steps of: forming a trench within a semiconductor substrate using a stacked layer as a mask, said stacked layer composed of a silicon oxide film and a silicon nitride film formed in an active region of said semiconductor substrate; forming a first insulation layer on a bottom and sides of said trench; depositing a first conductive layer on whole surface of said semiconductor substrate including said trench; etching back said conductive layer to be recessed from a top surface of said semiconductor substrate and forming bit lines of said first conductive layer on said bottom of said trench in a direction of column; filling a second insulation layer in said trench; removing said stacked layer and a part of said second insulation layer to expose said semiconductor substrate in said active region and planarizing said semiconductor substrate simultaneously; forming a gate insulation layer on said semiconductor substrate;

forming a gate structure of a second conductive layer on said gate insulation layer; forming a spacer of an insulation layer on said sides of said gate structure of said second conductive layer; forming source and drain regions on both sides of said gate structure of said second conductive layer;

forming a third insulation layer on said semiconductor substrate; connecting said bit lines to a first one of said source and drain regions with a plug of a third conductive layer filled in a contact hole inside said third insulation layer and said second insulation layer; forming a storage node electrode connected to a second one of said source and drain regions; and forming a plate electrode overlying a dielectric layer disposed said storage node electrode.

Accordingly, the present invention has the buried bit lines in the trench, making it easy to secure a process margin in the subsequent process, maintaining a constant width of the bit lines to lower the resistance thereof. Furthermore, the bit lines disposed under the word lines has an advantage over patterning the node contact due to the low step height, with enhanced capacitance of the capacitor.

10 Claims, 29 Drawing Sheets

METHOD FOR FABRICATING DYNAMIC RANDOM ACCESS MEMORY CELLS

BACKGROUND OF THE INVENTION

1. Field of the Invention

The present invention relates to a method for fabricating a dynamic random access memory (DRAM) cells and, more particularly, to a DRAM cells provided with a word line on bit line (WOB) type memory cell including a buried bit line structure.

2. Discussion of Related Art

A metal-oxide-semiconductor (MOS) type DRAM has a memory cell comprising one MOS transistor and one capacitor connected thereto. As developments have been made in DRAM device technique to achieve high integration and high speed response, each capacitor is shrunken to be of such a reduced size that the amount of charges stored in the capacitor is decreased. The decrease in the amount of charges results in soft errors that may destroy the content of memories. To overcome this problem, a method for increasing the occupied area of each capacitor has been proposed, in which storage nodes composed of polysilicon are formed in a semiconductor substrate in order to increase capacitance of the capacitor. The stacked capacitor according to this method is disposed on a transfer gate transistor and connected to a source or drain of the transfer gate transistor. Bit lines of the DRAM cell are normally composed of metal lines and disposed on an interlayer insulation layer over the word lines. The bit lines are connected to the source and drain regions of the transfer gate transistor through contact holes in the interlayer insulation layer (or a passivating insulation layer).

FIG. 1 is a plan view of a memory cell array of a DRAM according to a related art.

Referring to FIG. 1, in the surface of a semiconductor substrate 1 are formed a plurality of word lines 17a, 17b, 17c and 17d which run parallel with one another in rows, a plurality of bit lines 55 which run parallel with one another in columns, and a plurality of memory cells (MC) arranged at the respective intersections of the word lines and the bit lines. Each memory cell comprises one transfer gate transistor 53 and one capacitor 64. The transfer gate transistor 53 comprises a pair of source/drain regions 46 and 46 formed in the surface of the semiconductor substrate 1, and gate electrodes (word lines) 17b and 17c formed between the source/drain regions 46 and 46 with a gate insulation layer 15 interposed therebetween. A thick insulation layer is formed on the gate electrodes 17b and 17c. Subsequently, contact holes 29, 28 and 29 are formed in a predetermined portion of the insulation layer so as to reach the source/drain regions 46 and 46 of the transfer gate transistor 53.

Reference numerals 29 and 29 denote capacitor node contact portions and reference numeral 28 denotes a bit line contact portion. The contact holes 29, 28 and 29 formed by photolithography and the etching method are gap-filled with the plug of a conductive layer such as a doped polysilicon layer. The plug of the conductive layer is brought in contact with the semiconductor substrate 1 in the source and drain regions 46 and 46. A bit line contact hole 91 located over an element isolating insulation layer. In the memory cell array, the word lines have a predetermined width and arranged in parallel with a predetermined spacing from one another. The plural bit lines 55 running in parallel with one another in columns are isolated with an interlayer insulation layer or the like on the plural word lines 17a, 17b, 17c and 17d.

Now, manufacturing steps of the DRAM memory cell shown in FIG. 1 will be described with reference to sectional views of FIGS. 2A to 2L.

FIGS. 2A to 2L are cross-sectional views taken along the line A–A' of FIG. 1 showing the manufacturing steps of the DRAM memory cell.

Referring to FIG. 2A, an element isolating insulation layer 11 and a channel stopper region (not shown) are formed in predetermined regions on the main surface of a P-type semiconductor substrate 1. A gate insulation layer 15, a polysilicon layer 17 and an interlayer insulation layer 19a are sequentially formed on the surface of the semiconductor substrate 1.

The element isolating insulation layer 11 may be formed by a selective oxidation method such as a LOCOS (Local Oxidation of Silicon) method or other methods including STI (Shallow Trench Isolation). The gate insulation layer 15 is formed by the thermal oxidation method. The polysilicon layer 17 and the interlayer insulation layer 19a are each deposited to a thickness of 1000–2000 Å by the CVD method.

Referring to FIG. 2B, word lines 17a, 17b, 17c and 17d are formed by photolithography and the etching method. The interlayer insulation layer 19a of the patterned oxide film is left on the surface of the word lines 17a–17d.

Referring to FIG. 2C, an insulation layer is formed on the whole surface of the semiconductor substrate 1 by the CVD method, and is etched by an anisotropic reactive ion etching (RIE) to form a sidewall spacer 20 on the peripheries of the word lines 17a–17d. Impurity ions 40, arsenic are implanted under an implantation energy 30 KeV, a dose of $4.0 \times 10^{15}/cm^2$ in the surface of the silicon substrate 1 by using the word lines 17a–17d covered with the insulation layer 19a and the spacer 20 as masks to form the source and drain regions 46 and 46 of the transfer gate transistor.

Referring to FIG. 2D, the surface of the semiconductor substrate 1 is planarized with an interlayer insulation layer 26a e.g., a BPSG (Borophosphorosilicate Glass) film. Contact holes 31 and 33 are formed in the bit line contact portion 28 and the capacitor node contact portion 29 by photolithography and the etching method, which is followed by deposition of doped polysilicon. Then, polysilicon plugs 28 and 29 are formed in the contact holes by an etch-back method.

The plugs may be formed not only by the etch-back technique using the RIE but also by other methods including CMP (Chemical Mechanical Polishing).

Referring to FIG. 2E, an insulation layer 61 is deposited on the whole surface of the semiconductor substrate 1, isolating the plugs 28 and 29. Contact holes (not shown) are formed over the bit line contact portion 28. A conductive layer such as a doped polysilicon layer or a metal layer, and a metal suicide layer, etc. are formed on the surface of the semiconductor substrate 1, which are patterned by photolithography and the etching method. As a result, the bit lines (not shown) are formed.

Subsequently, an etching stopping layer 63 such as a nitride ($Si_3N_4$) film having a thickness of more than 100 Å is formed and then a silicon oxide ($SiO_2$) film 65a having a thickness of more than 5000 Å is formed on the surface of the nitride film 63.

Here, the bit lines are disposed above the element isolating insulation layer of the memory cell array and, in the perpendicular direction to the word lines, arranged in parallel with the active region of the memory cell array having two transfer gate transistors as MOS transistors formed thereon.

Referring to FIG. 2F, a capacitor isolating layer 65 for isolating the adjacent capacitors is formed by patterning the oxide film 65a by the etching method. The selective ratio of the etching of the nitride film 63 which is an etching stopping layer to the oxide film 65a is extremely high. Therefore, in this etching step, the nitride film 63 is etched at a rate different from that of the oxide film 65a.

Referring to FIG. 2G, contact holes 70 and 70 are formed so as to reach the plug of the capacitor node contact portion 29 on the source and drain regions 46 and 46 by photolithography and the etching method.

Referring to FIG. 2H, a polysilicon layer 72 of a thickness of 500–1500 Å is deposited on an inner surface of the contact hole 70, on the surface of the nitride film 63 and on the surface of the capacitor isolating layer 65 by the CVD method. Then, a thick resist 75 is applied over a surface of the polysilicon layer 72.

Referring to FIG. 2I, the resist 75 is etched back to expose a part of the polysilicon layer 72.

Referring to FIG. 2J, the exposed surface of the polysilicon layer 72 is selectively removed by anisotropic etch or the like. As a result, the polysilicon layer 72 is isolated on the surface of the capacitor isolating layer 65 to form a lower electrode 80 of the capacitor.

Referring to FIG. 2K, the resist 75 is removed by the etching method and furthermore the capacitor isolating layer 65 is removed by a plasma etching method. Then, a dielectric layer 84 such as a nitride film is formed on the surface of the lower electrode 80.

Referring to FIG. 2L, an upper electrode 85 at a thickness of 2000–3000 Å of a polysilicon layer is formed on the surface of the dielectric layer 84 by the CVD method. Thereafter, an insulation layer 88 and an interconnection layer 90 are formed to complete the manufacturing steps of the memory cell of the DRAM.

The memory cell of the DRAM according to the related art has the arrangement in which the plugs used as the capacitor node contact portion and the bit line contact portion are formed in the source and drain regions of the transfer gate transistor by photolithography and the etching method after the word lines are formed. These patterns in a linear arrangement are aligned to dispose between the transfer gates. This requires that the transfer gates be spaced farther apart than is otherwise desired to provide ample room between transfer gates for making desired contacts to active areas. Such increase in transfer gate pitch works against the integration of the memory cell. Another problem lies in that soft errors occur due to a parasitic capacitance, since the capacitor of memory cell adjoins the peripheries and the top portion of the bit lines.

SUMMARY OF THE INVENTION

Accordingly, an object of the present invention is to provide a method for fabricating DRAM cells having a buried bit line in a trench within a substrate.

Another object of the present invention is to provide a structure of the DRAM cell having a stacked structure disposed on a buried bit line in a trench within the substrate.

To achieve the first object of the present invention, there is provided a method for fabricating DRAM cells including the steps of: forming a trench within a semiconductor substrate using a stacked layer as a mask, said stacked layer composed of a silicon oxide film and a silicon nitride film formed in an active region of said semiconductor substrate; forming a first insulation layer on a bottom and sides of said trench; depositing a first conductive layer on whole surface of said semiconductor substrate including said trench; etching back said conductive layer to be recessed from a top surface of said semiconductor substrate and forming bit lines of said first conductive layer on said bottom of said trench in a direction of column; filling a second insulation layer in said trench; removing said stacked layer and a part of said second insulation layer to expose said semiconductor substrate in said active region and planarizing said semiconductor substrate simultaneously; forming a gate insulation layer on said semiconductor substrate; forming a gate structure of a second conductive layer on said gate insulation layer; forming a spacer of an insulation layer on said sides of said gate structure of said second conductive layer; forming source and drain regions on both sides of said gate structure of said second conductive layer; forming a third insulation layer on said semiconductor substrate; connecting said bit lines to a first one of said source and drain regions with a plug of a third conductive layer filled in a contact hole inside said third insulation layer and said second insulation layer; and
forming a capacitor connected to a second one of said source and drain regions.

To achieve the second object of the present invention, there is provided a memory cell array structure of DRAM including: a plurality of memory cells formed on a main surface of a semiconductor substrate, said memory cells each comprising one transistor and one capacitor; a plurality of bit lines of a first conductive pattern formed in a trench, said bit lines being arranged in a first direction; at least one active region surrounded with said trench within said substrate, said active region each having two second conductive patterns disposed therein; two word lines overlying a gate insulation layer disposed between said two second conductive patterns and said active region, said word lines being arranged in a second direction perpendicular to said first direction; a spacer formed on a sides of said two word lines;
source and drain regions formed in said active region; a plug connected a first one of said source and drain regions to said bit lines; and a capacitor connected to a second one of said source and drain regions.

BRIEF DESCRIPTION OF THE ATTACHED DRAWINGS

DETAILED DESCRIPTION OF PREFERRED EMBODIMENT

Hereinafter, the present invention will be described in detail with reference to the accompanying drawings.

Figure 1:
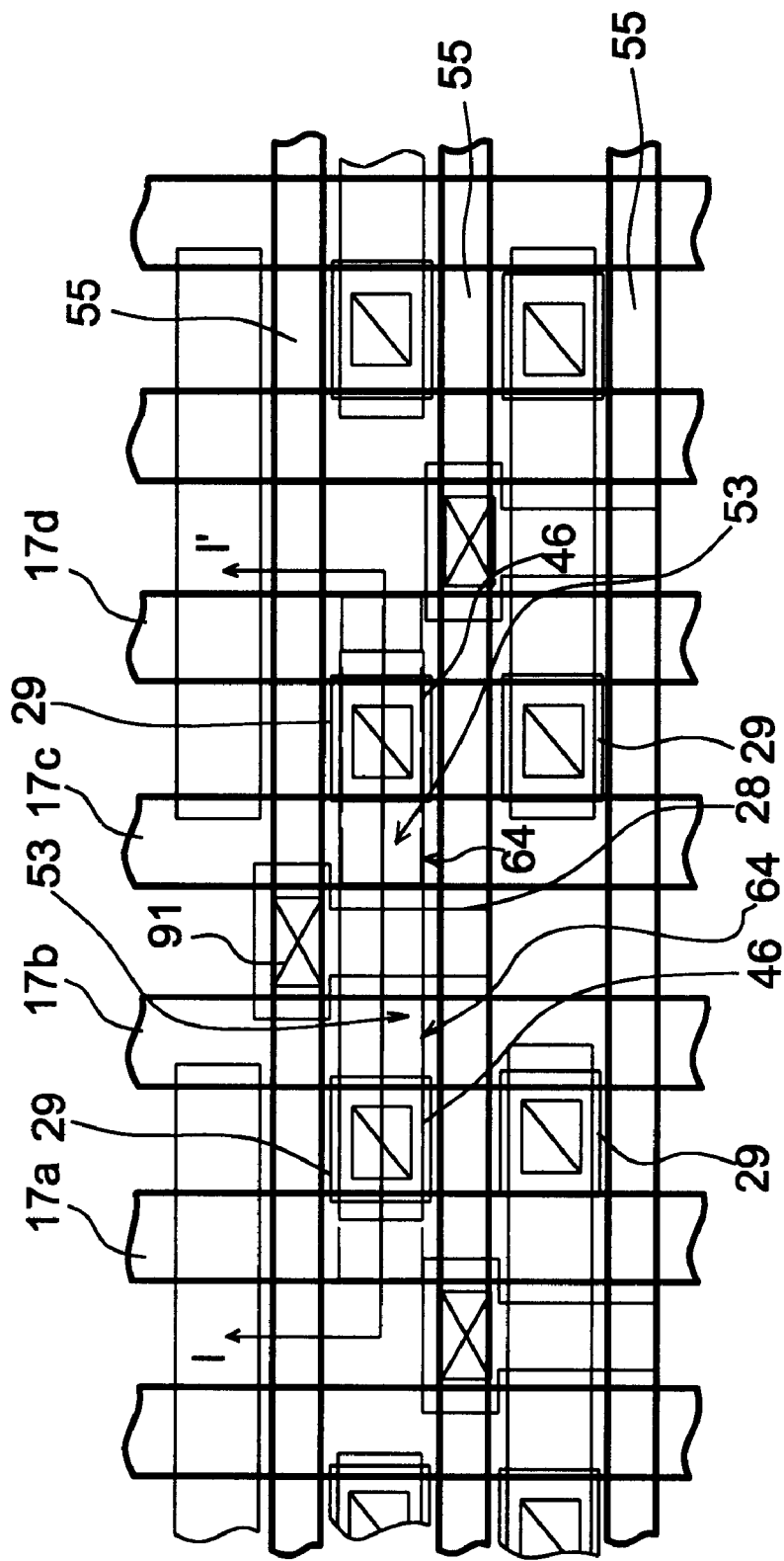
FIG. 1 is a plan view of a memory cell array of a DRAM according to a related art.
Figure 2A:
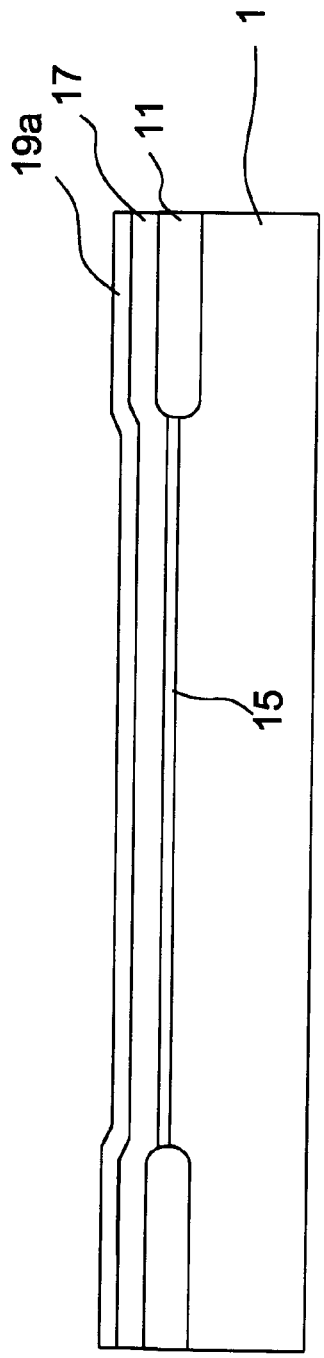
FIGS. 2A to 2L are sectional views taken along a line A–A' in FIG. 1 showing the manufacturing steps of the DRAM.
Figure 2B:
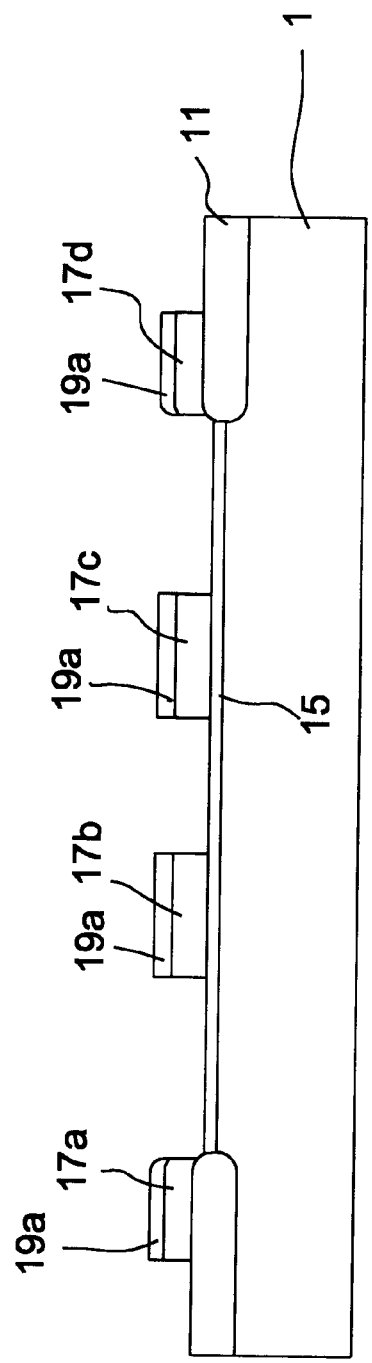
Figure 2C:
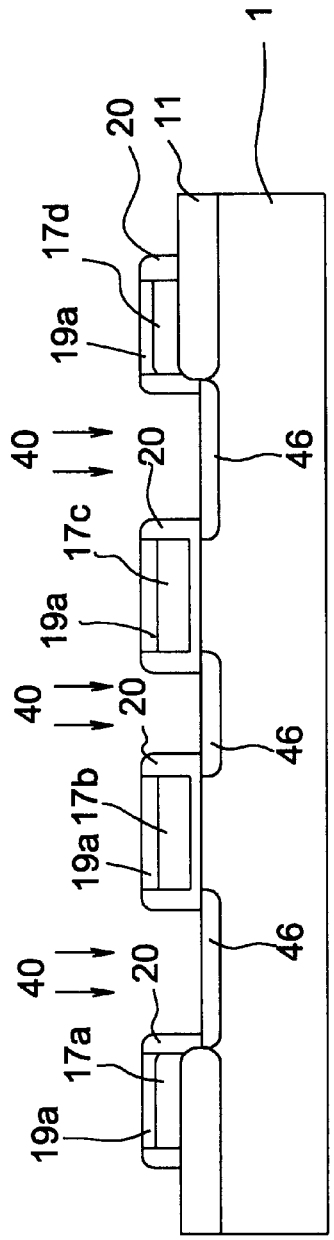
Figure 2D:
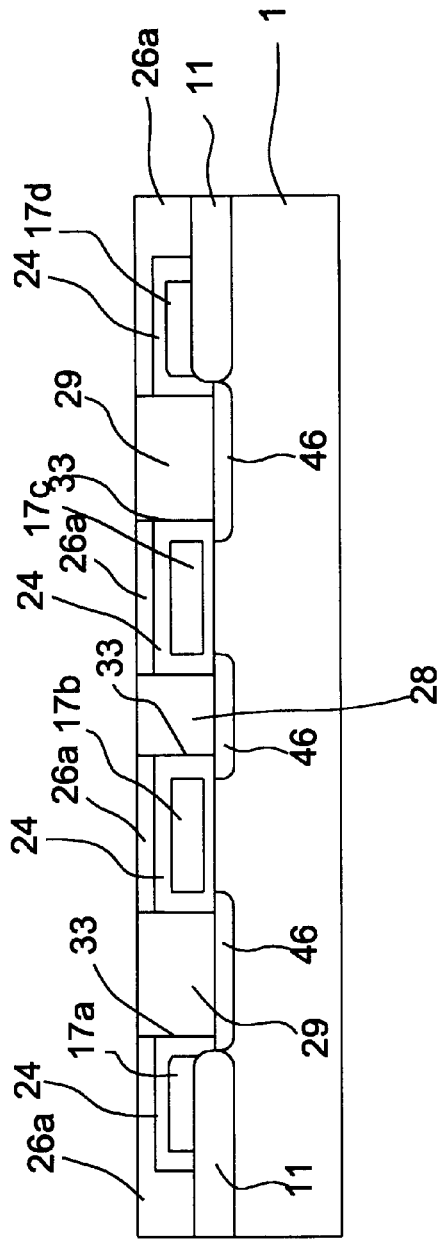
Figure 2E:
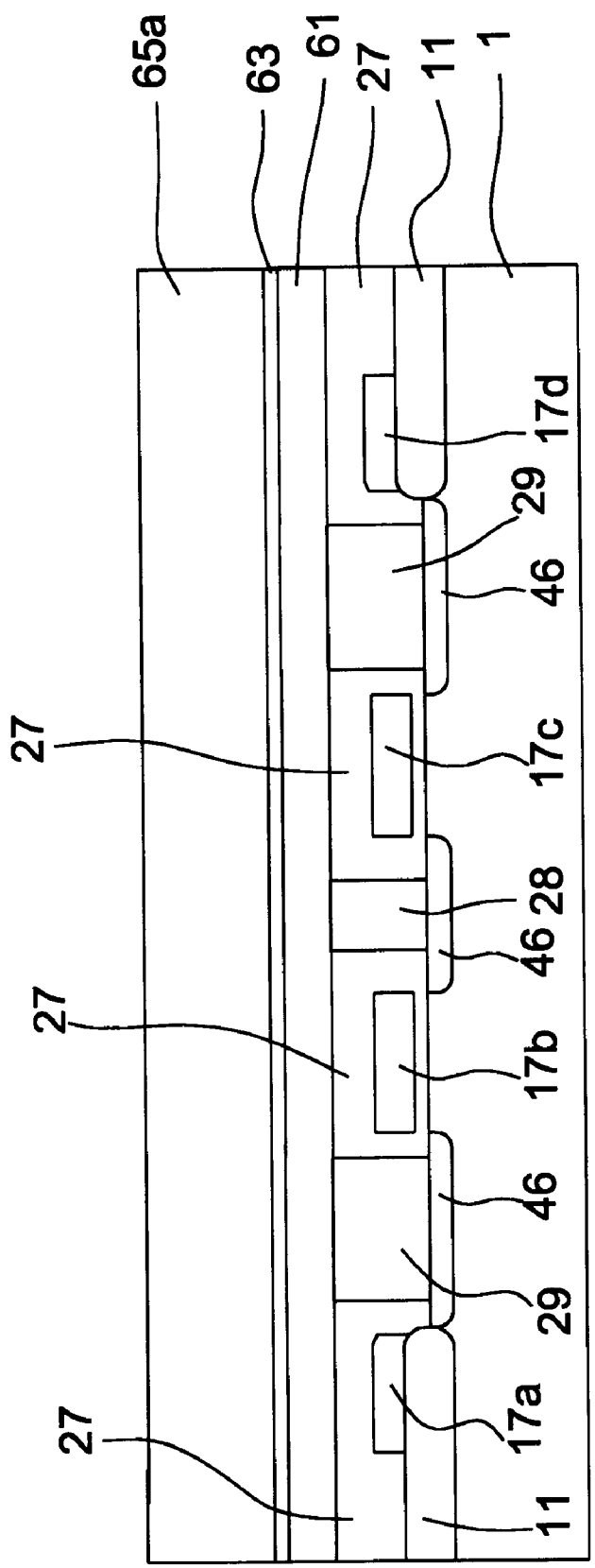
Figure 2F:
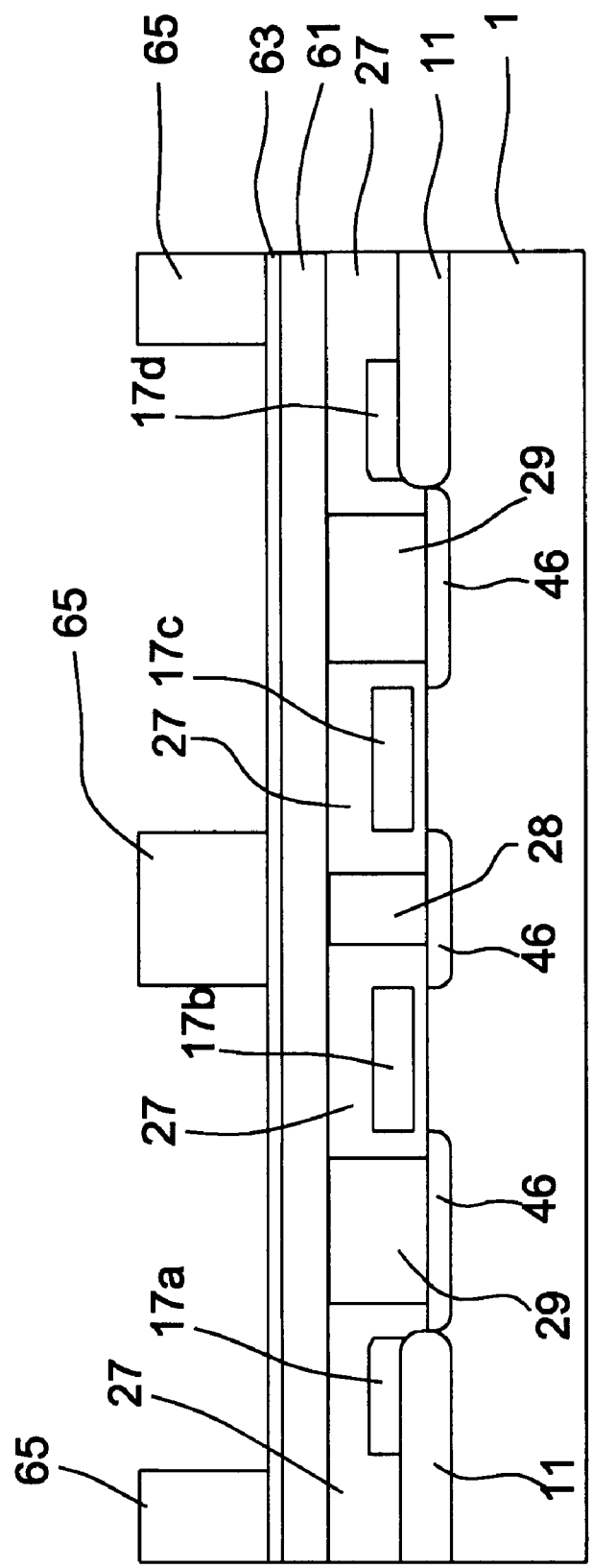
Figure 2G:
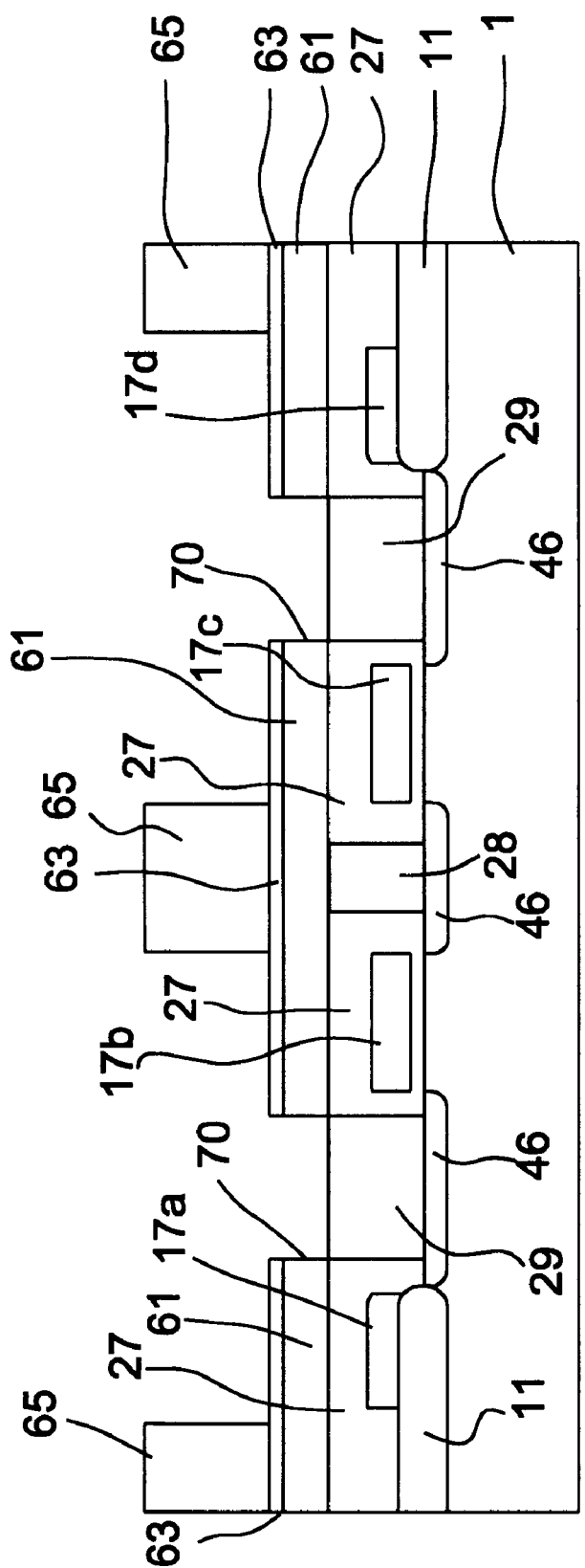
Figure 2H:
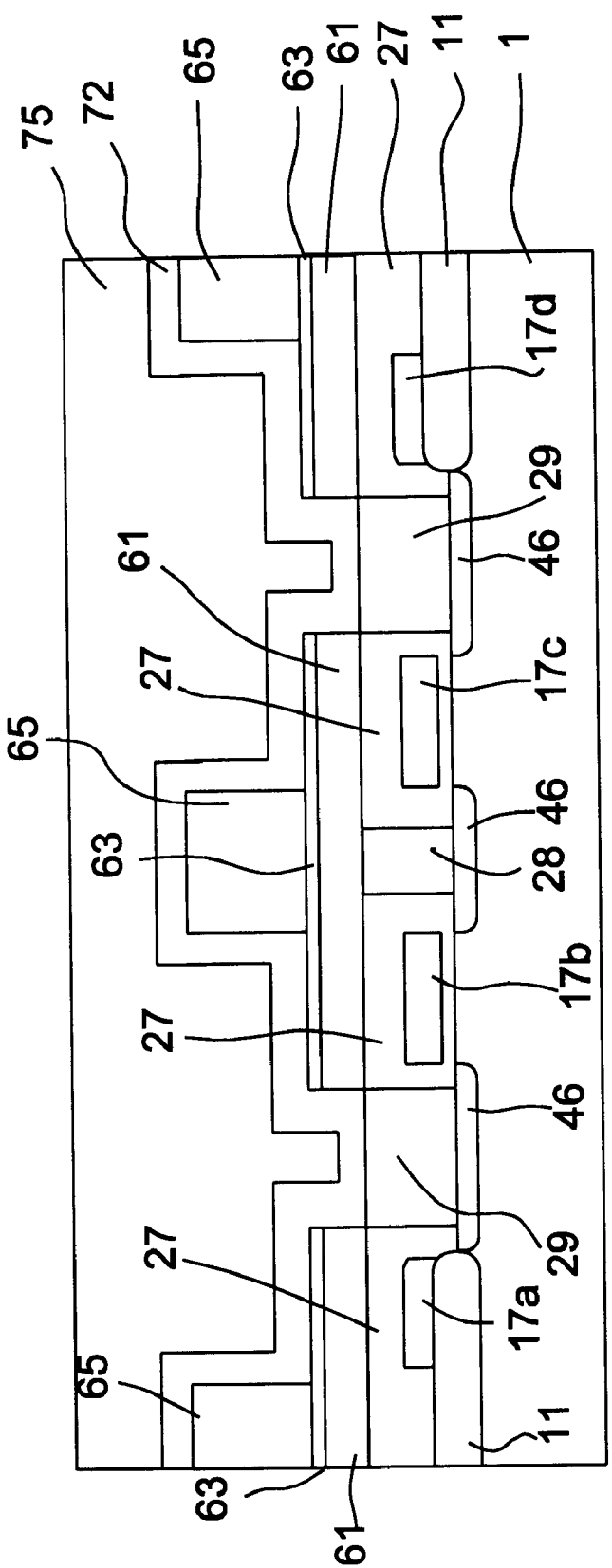
Figure 2I:
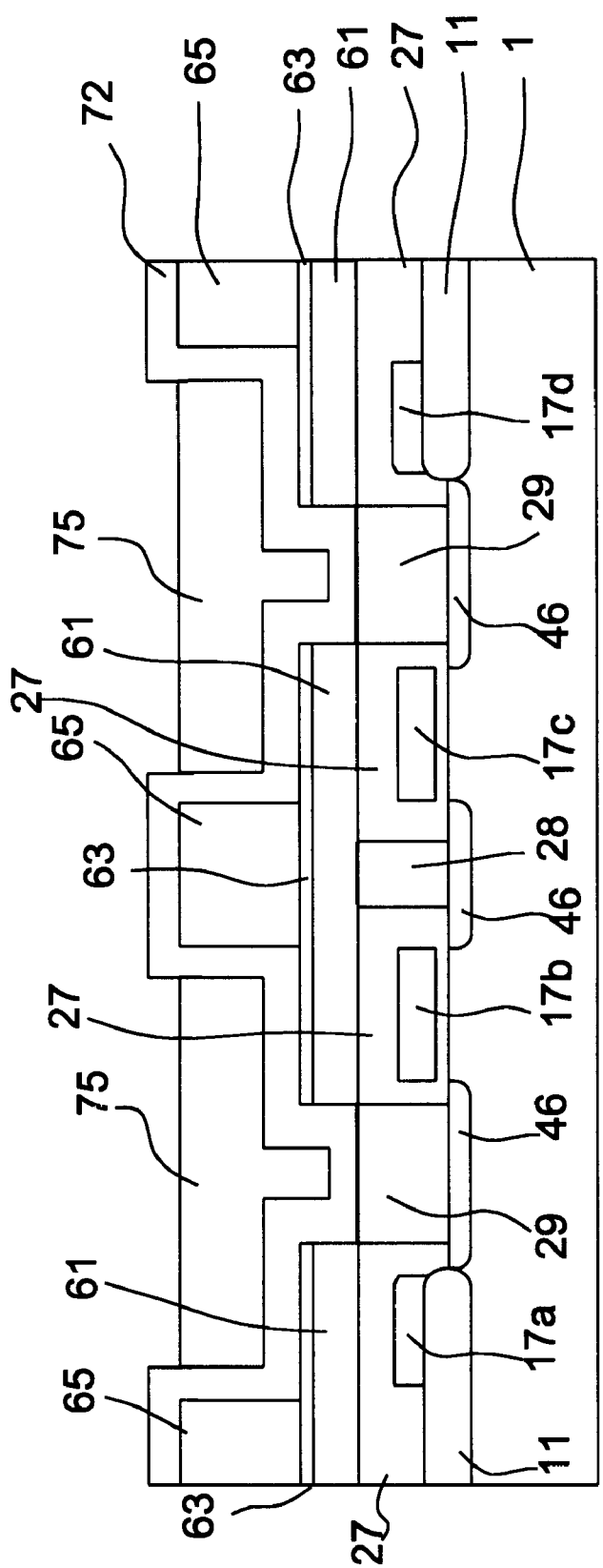
Figure 2J:
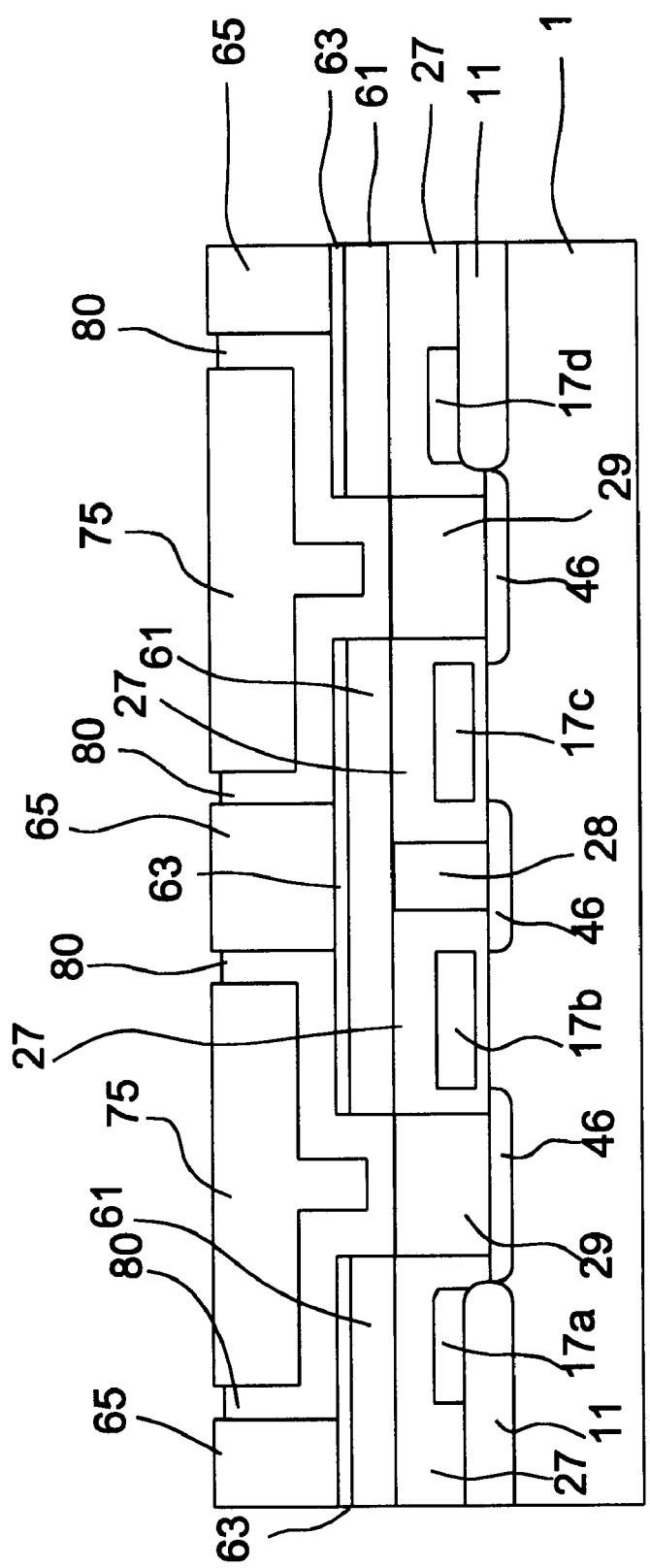
Figure 2K:
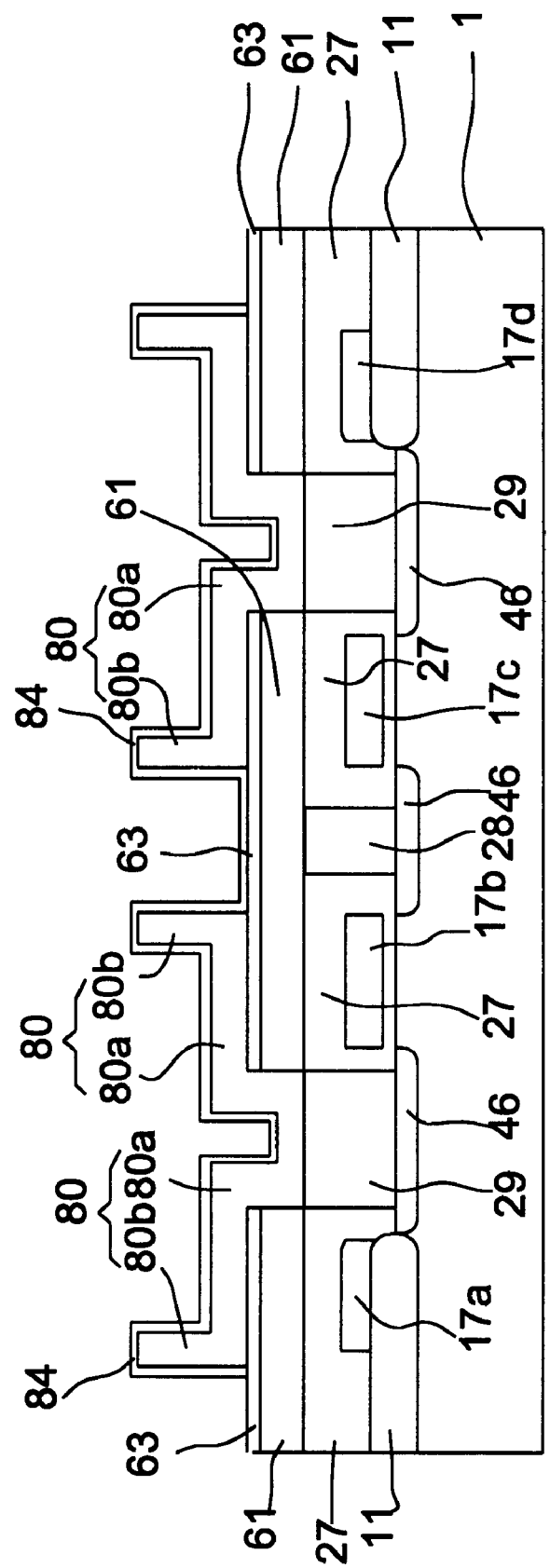
Figure 2L:
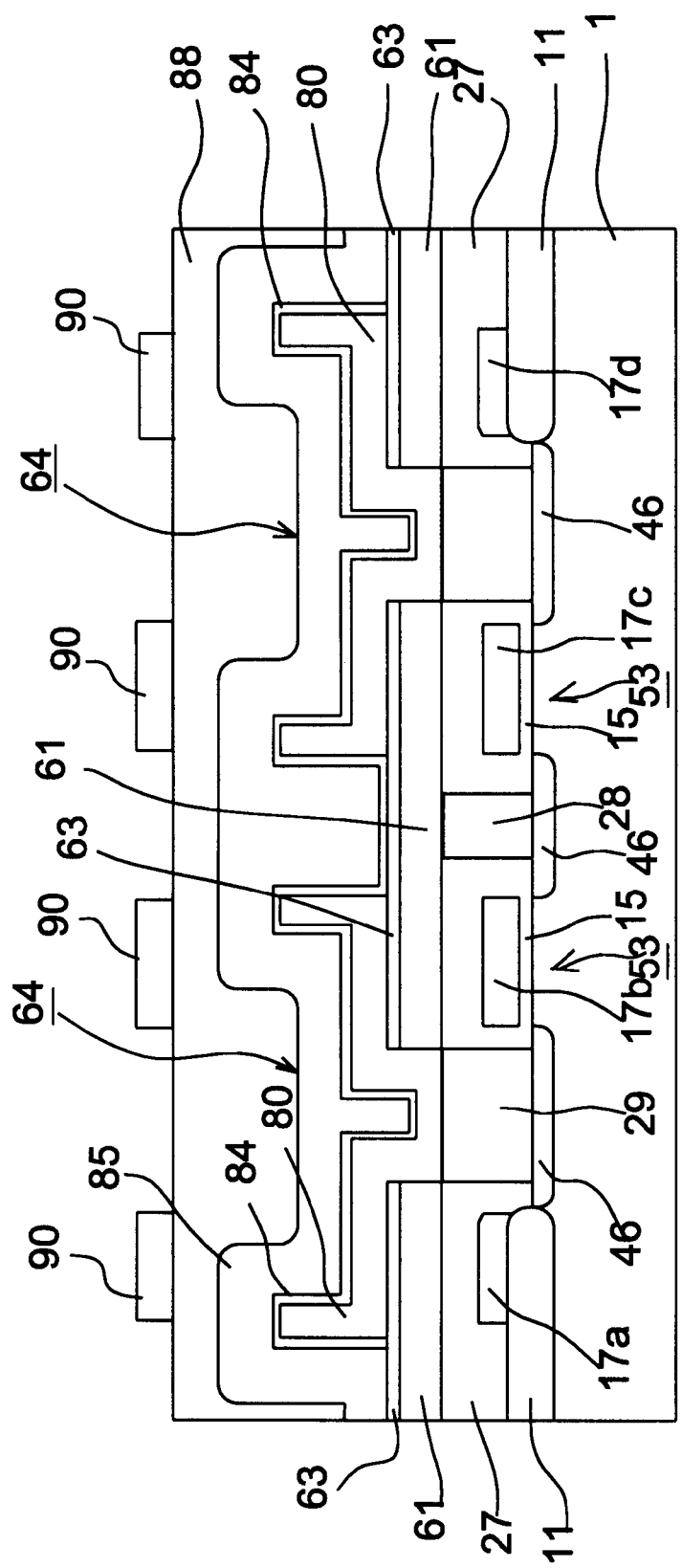
Figure 3:
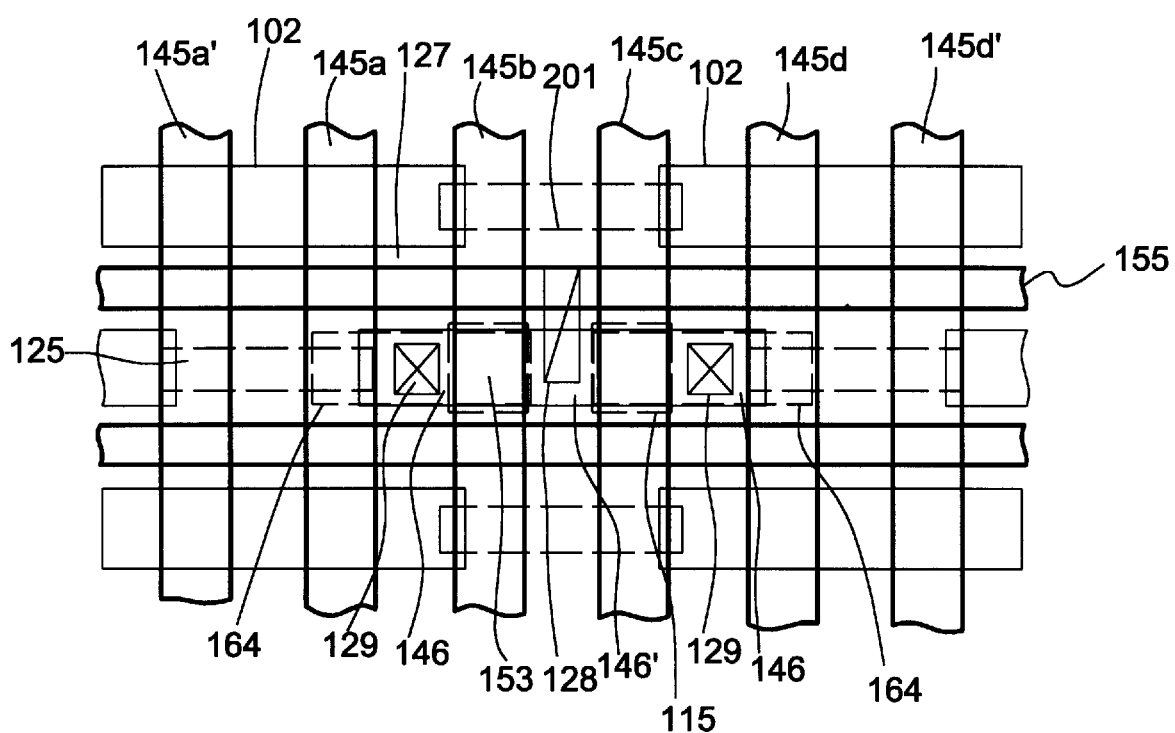
FIG. 3 is a plan view of a memory cell array of a DRAM according to the present invention.

FIG. 3 is a plan view of a memory cell array of a DRAM according to the present invention.

Referring to FIG. 3, in the surface of a semiconductor substrate 101 are formed a plurality of word lines 145a', 145a, 145b, 145c, 145d and 145d' which run parallel with one another in rows, a plurality of bit lines 155 which run parallel with one another in columns, and a plurality of memory cells (MC) arranged at the nearest intersections of the word line and the bit lines. Each memory cell comprises one transfer gate transistor 153 and one capacitor 164 connected thereto. The transfer gate transistor 153 comprises a pair of source/drain regions 146 and 146 formed in the surface of the semiconductor substrate 101, and gate electrodes (word lines) 145b and 145c formed between the source/drain regions 146 and 146 with a gate insulation layer 115 interposed therebetween. A thick insulation is formed on the gate electrodes. There are further formed storage contact holes 129 and 129 exposing the source and drain regions 146 and 146 of the transfer gate transistor 153, and a contact holes 128 exposing the buried bit lines 155 within a trench as well as the first region 146 of the source and drain regions 146 and 146.

The word lines in the memory cell array have a predetermined width and are arranged in parallel with one another with a predetermined spacing therebetween.

A single plot and a composite plot of the manufacturing steps for the memory cell array shown in FIG. 3 are described in connection with FIGS. 4A to 4H.

FIGS. 4A to 4H are plan views showing a single plot and a composite plot of the manufacturing steps for the memory cell array;

FIGS. 5A to 5H are cross-sectional views taken along a line A–A' in FIGS. 4A to 4H, respectively, showing the manufacturing steps of the DRAM cell; and FIGS. 6A to 6H are cross-sectional views taken along a line B–B' in FIGS. 4A to 4H, respectively, showing the manufacturing steps of the DRAM cell.

Figure 4A:
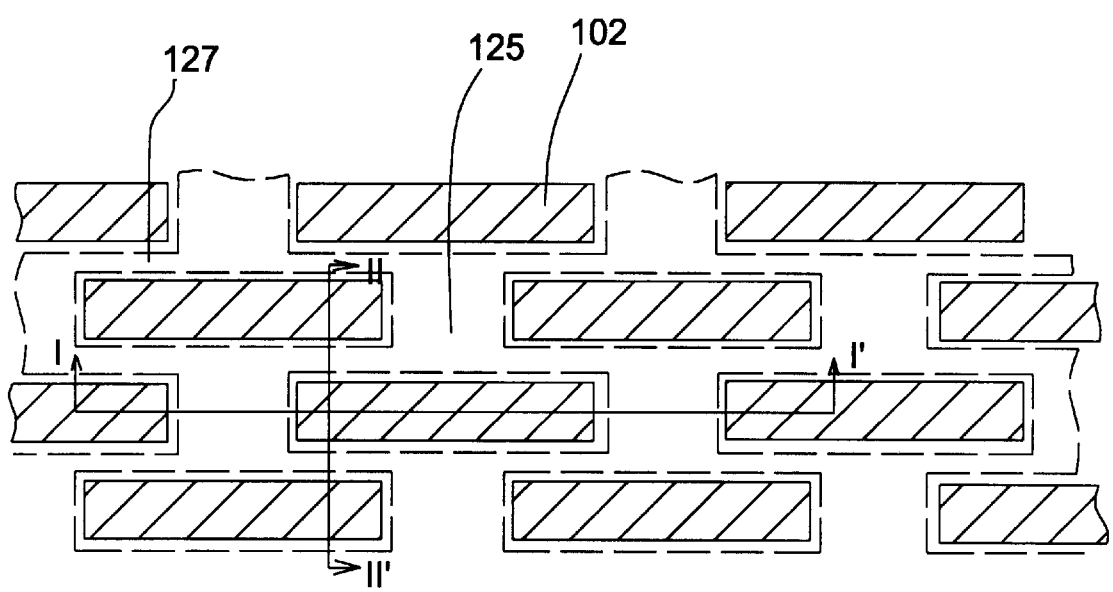
FIGS. 4A to 4H are plan views showing a single plot and a composite plot by the manufacturing steps of the memory cell array.
Figure 5A:
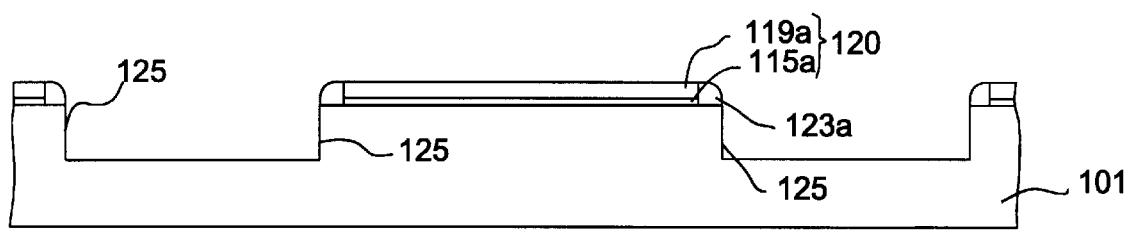
FIGS. 5A to 5H are cross-sectional views taken along a line A–A' in FIGS. 4A to 4H, respectively, showing the manufacturing steps of the DRAM cell.
Figure 6A:
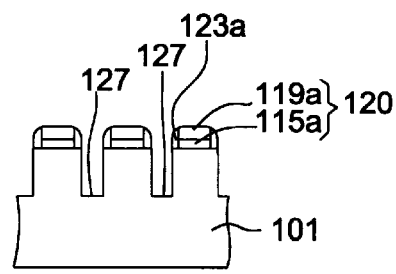
FIGS. 6A to 6H are cross-sectional views taken along a line B–B' in FIGS. 4A to 4H, respectively, showing the manufacturing steps of the DRAM cell.

Referring to FIGS. 4A, 5A and 6A, a silicon oxide ($SiO_2$) film 115a and a silicon nitride ($Si_3N_4$) film are successively deposited on the semiconductor substrate 101. An active region 102 is patterned by lithography using the deep UV, and then stacked layers of the silicon nitride film ($Si_3N_4$) 119a and the silicon oxide film ($SiO_2$) film 115a on an element isolating region is removed by an anisotropic plasma etching. A silicon oxide ($SiO_2$) film is deposited by the CVD and selectively etched by a selective anisotropic RIE to form spacers 123a on the peripheries of an active stack 120. Then, shallow trenches 125 and 127 of a depth of 4000–6000 Å are formed within the semiconductor substrate 101 using an etchant gases such as $Cl_2$ or the like.

Here, the active patterns having a feature size of about 0.12–0.18 μm are formed by the lithography using the deep UV rays.

Figure 4B:
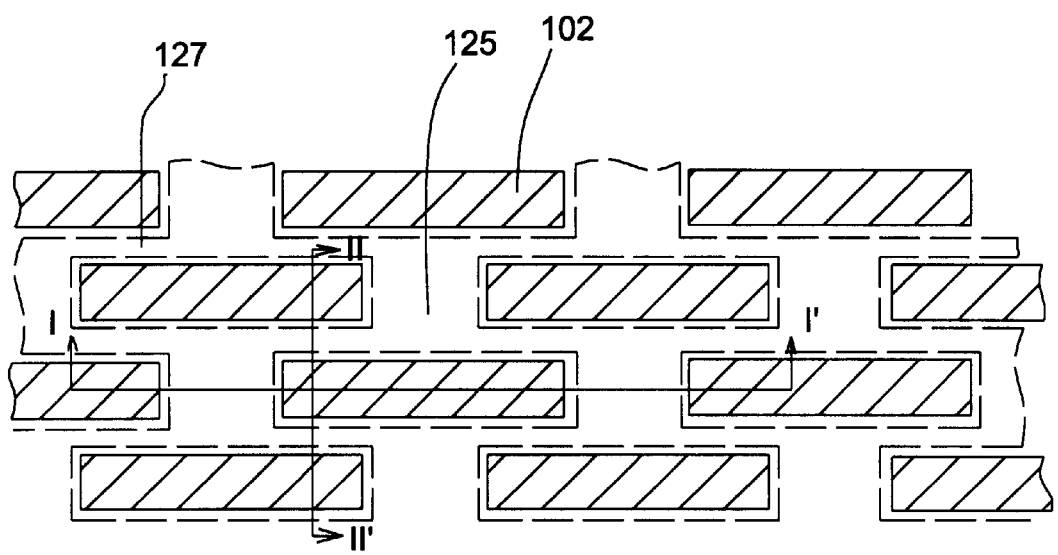
Figure 5B:
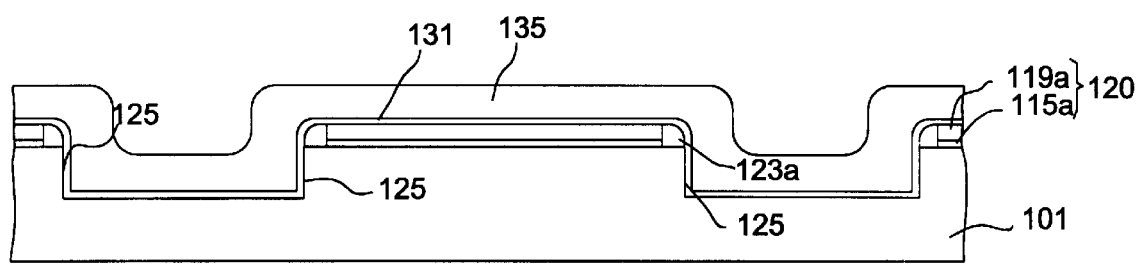
Figure 6B:
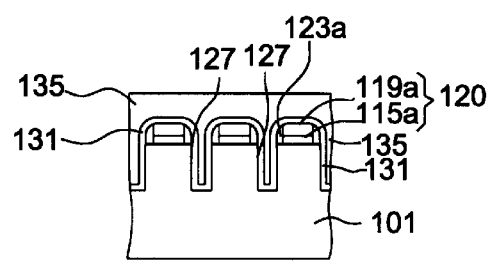

Referring to FIGS. 4B, 5B and 6B, the semiconductor substrate 101 is subjected to a thermal oxidation to form a thin silicon oxide film ($SiO_2$) (not shown) on the bottom and the sides of the shallow trenches 125 and 127. A thin, doped polysilicon layer 131 is deposited on the whole surface of the semiconductor substrate 101 and, subsequently, a thick conductive layer 135 is deposited to such a thickness as to completely fill the shallow trench 127 having a smaller width.

Here, a tungsten layer used for the conductive layer 135 is deposited to a thickness of 1500–2500 Å by the CVD method using $WF_6$ as a source.

Figure 4C:
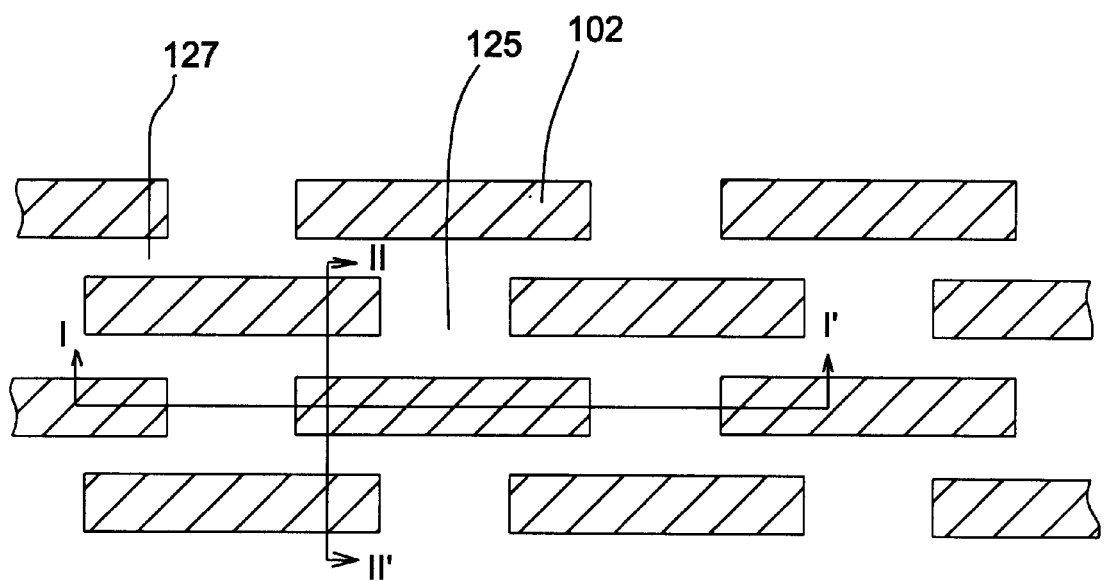
Figure 5C:
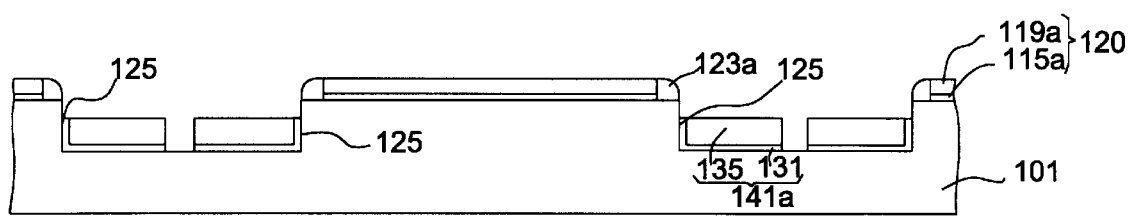
Figure 6C:
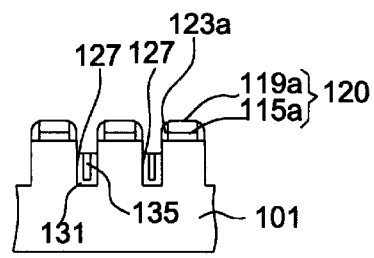

Referring to FIGS. 4C, 5C and 6C, the conductive layer 135 and the doped polysilicon layer 131 are selectively etched by the anisotropic RIE using $Cl_2$ as an etchant gas, to expose the top surface of the active stack 120. After a further etching, the conductive layer 135 and the doped polysilicon layer 131 in the shallow trench 127 having a smaller width are recessed to a depth of 1000–2000 Å from the top surface of the semiconductor substrate 101, completely filling the shallow trench 127. On the other hand, the conductive layer 135 and the doped polysilicon layer 131 in the shallow trench 125 having a larger width are recessed to a depth of 1000–2000 Å from the top surface of the semiconductor substrate 101 to expose a part of the bottom of the trench 125, so that spacers 141a composed of the doped polysilicon layer 131 and the conductive layer 135 are formed to a considerably large width on the sides in the trench 125.

Figure 4D:
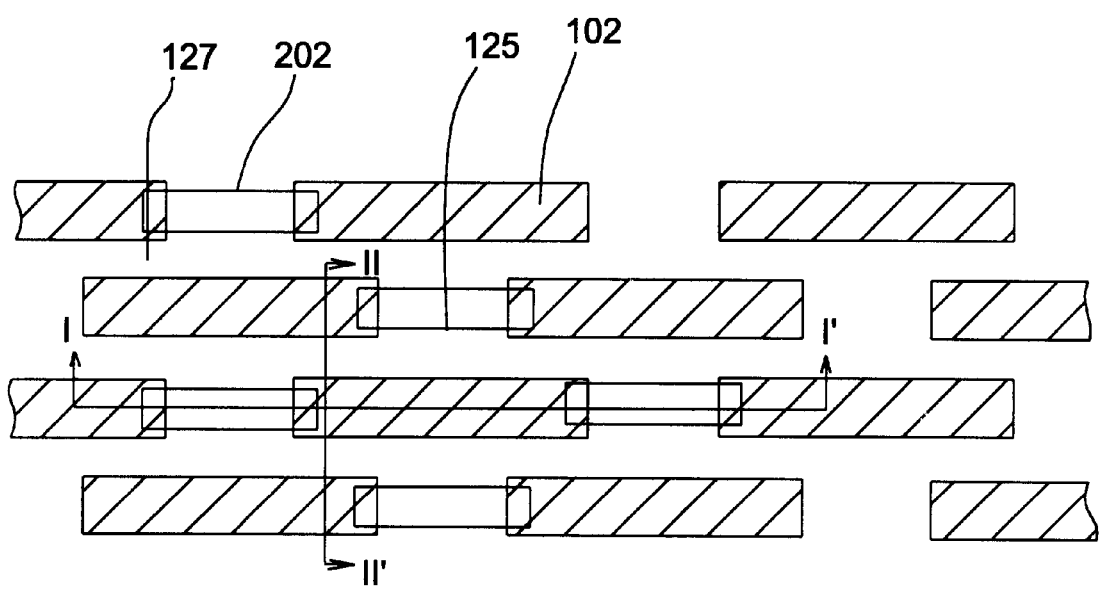
Figure 4:
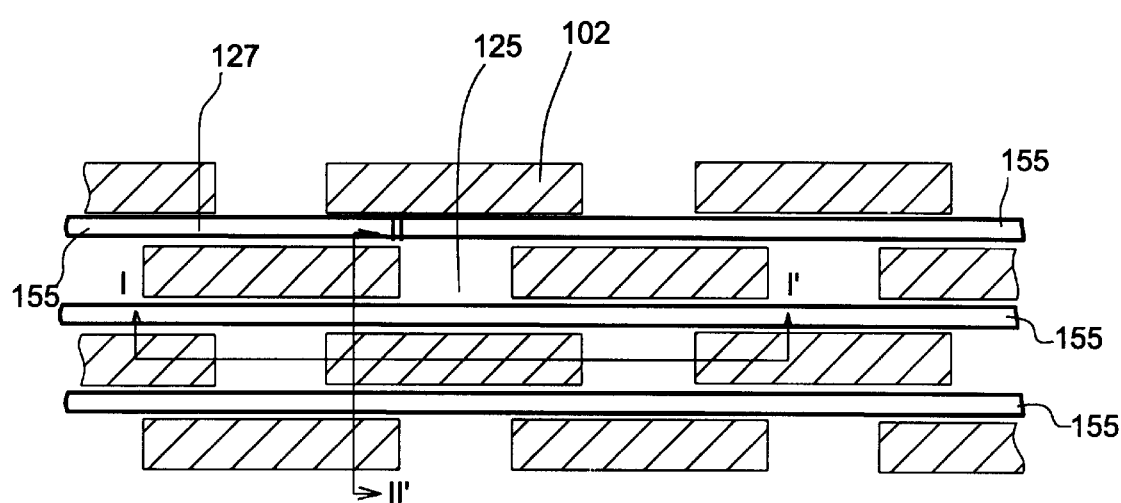
Figure 5D:
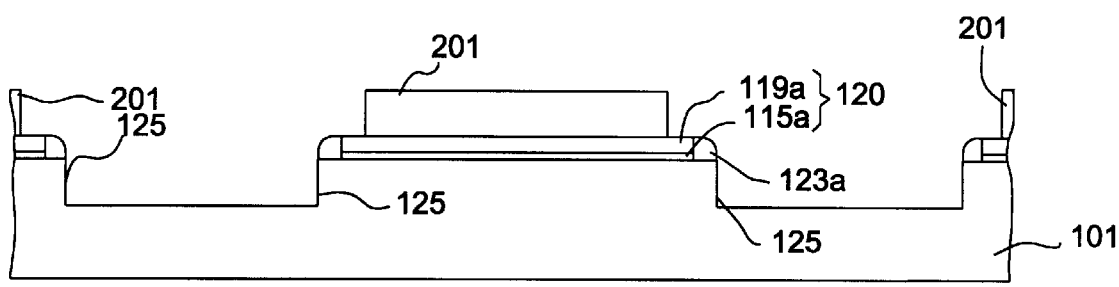
Figure 6D:
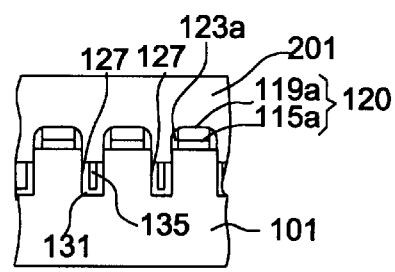

Referring to FIGS. 4D, 5D and 6D, using the deep UV lithography, a pattern 202 is formed between the memory array cells in the A–A' direction (in columns) to expose a part of the shallow trench 125 having a larger width. Then, the spacers 141a of considerably large width, which is composed of the doped polysilicon layer 131 and the conductive layer 135, is removed from the inside of the trench 125 where a resist 201 was not covered by the selective anisotropic RIE using $Cl_2$ as an etchant.

Figure 5E:
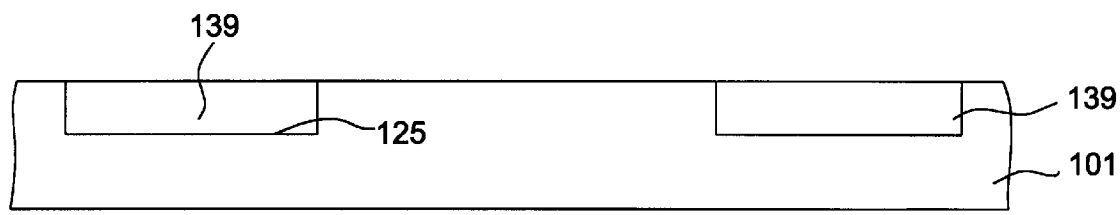
Figure 6E:
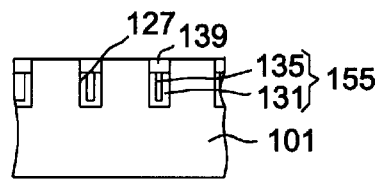

Referring to FIGS. 4E, 5E and 6E, the shallow trenches 125 and 127 are filled with a CVD silicon oxide ($SiO_2$) film 139 deposited by the CVD method and subjected to CMP (Chemical Mechanical Polishing) planarization, densification process as heat treatment. The silicon nitride ($Si_3N_4$) film 119a of the active stack 120 is removed with a solution of hot phosphoric acid. Then, the silicon oxide ($SiO_2$) film 115a and the spacers 123a are removed with a diluted HF etchant to expose the silicon substrate 101 in the active region, and a part of the CVD silicon oxide ($SiO_2$) 139 in the element isolating region is removed, thereby planarizing the whole surface of the substrate 101.

Here, the CVD silicon oxide ($SiO_2$) film 139 is formed by an USG (Undoped Silicate Glass) or an HDP (High Density Plasma), and the densification is a heat treatment performed at a processing temperature of 1000 celsius degree for 30–40 min. The bit lines 155 which are of a composite structure of polysilicon film 131 and tungsten 135 are buried in the shallow trench 127 within the element isolating region and surrounded with the CVD silicon oxide ($SiO_2$) film and a thermally grown silicon oxide ($SiO_2$) film (not shown) formed on the bottom and sides of the trench 127.

Figure 4F:
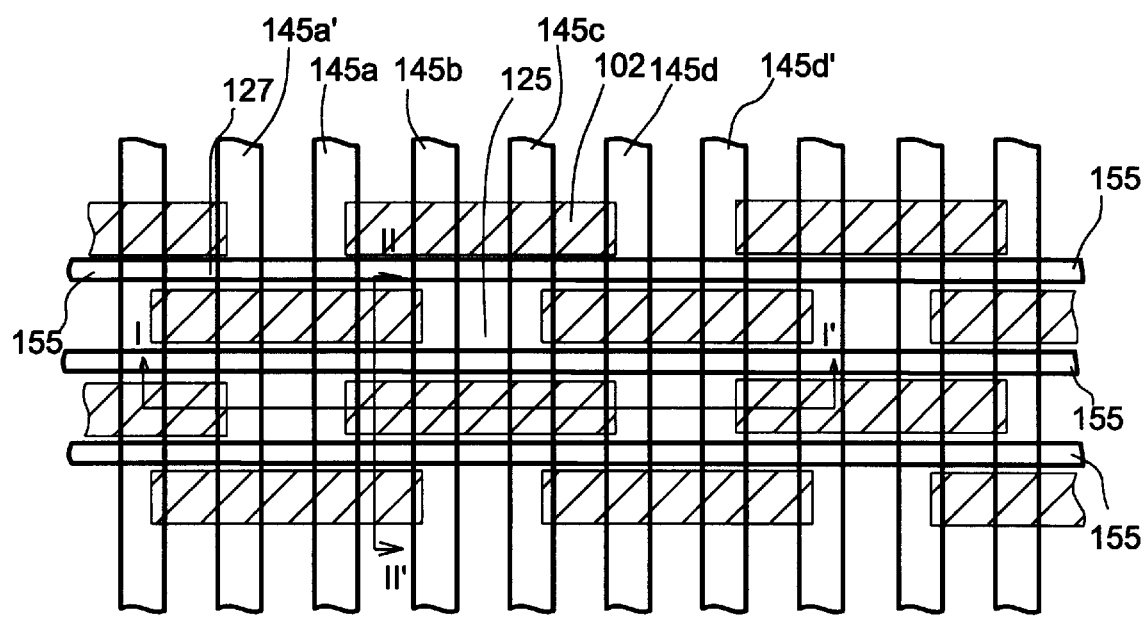
Figure 5F:
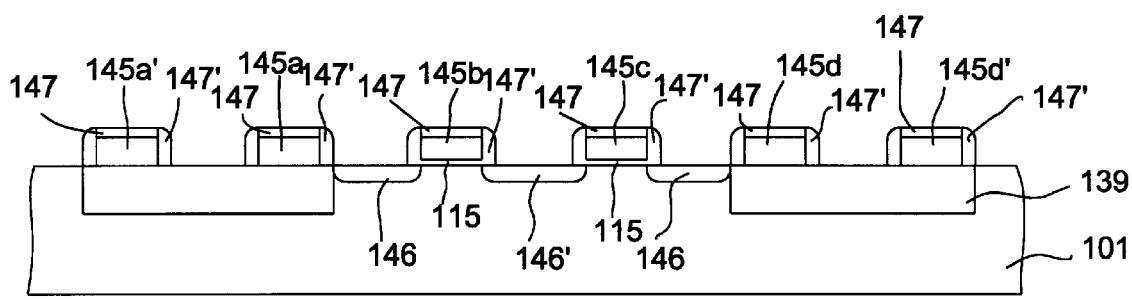
Figure 6F:
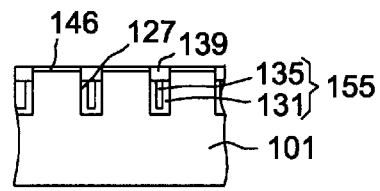

Referring to FIGS. 4F, 5F and 6F, a gate insulation layer 115 is formed, for example, to a thickness of 50–150 Å by the thermal oxidation. A polysilicon layer and an interlayer insulation layer 147 are respectively deposited to a thickness of 1000–2000 Å on the whole surface of the substrate 101 by the CVD method. The gate electrode 145 and the interlayer insulation layer 147 are patterned by the RIE. Then, an interlayer insulation layer 147' composed of silicon oxide ($SiO_2$) layer or silicon nitride ($Si_3N_4$) layer or undoped polysilicon is deposited on the whole surface of the substrate 101 and then performed blanket etch by the RIE to form a spacer 147' of the interlayer insulation layer on the sides of the gate electrode 145. Impurity ions 140, arsenic (As) or phosphorus (P) are implanted under an implantation energy 30 KeV, a dose of $4.0 \times 10^{15}/cm^2$ in the surface of the silicon substrate 101 by using the word lines 145a, 145b, 145c and 145d covered with the interlayer insulation layer 147 and the spacer 147' as masks to form the source and drain regions 146 and 146' of the transfer gate transistor.

When the first one 146' of the source and drain regions 146 and 146' of the transfer gate transistor is defined as a drain, the second one 146 is determined as a source of itself. In other words, each of the first and second ones of the source and drain regions 146 and 146' is not fixed, but interchangeable.

Figure 4G:
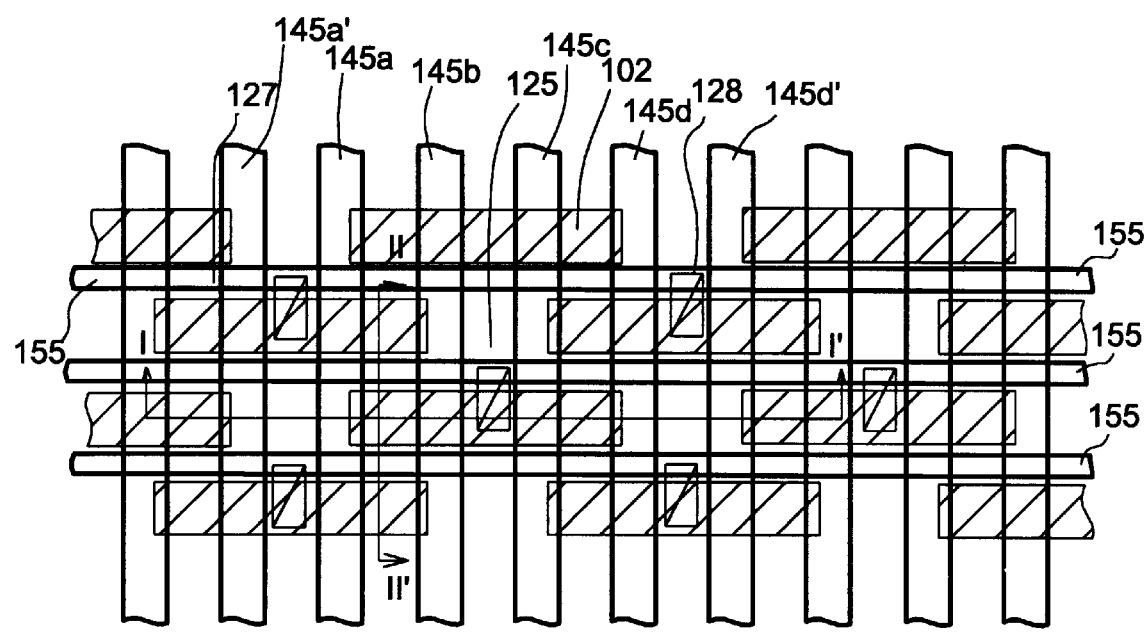
Figure 5G:
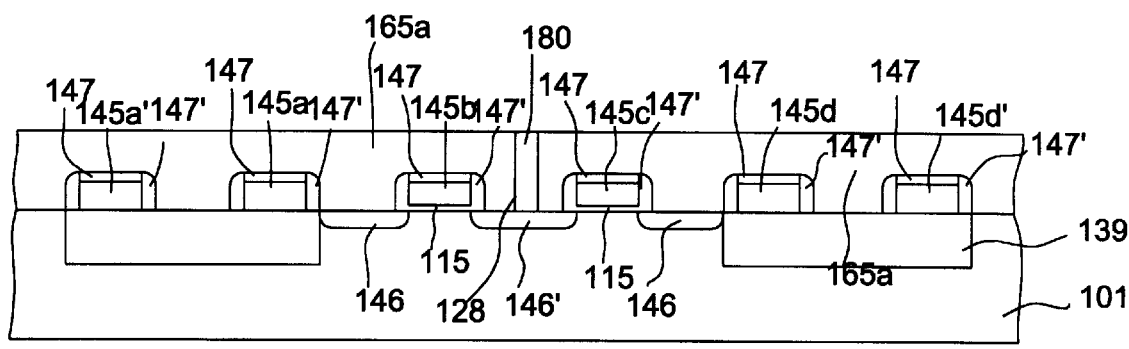
Figure 6G:
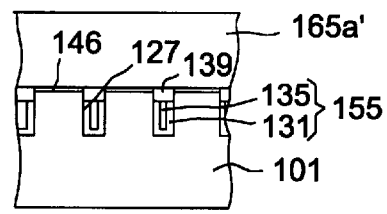

Referring to FIGS. 4G, 5G and 6G, an interlayer insulation layer 165a of a BPSG (Borophosphorosilicate) film or the like is deposited and then formed contact holes 128 exposing both the bit lines 155 in the element isolating region and an N-type diffusion layer 146 in the center of the active region by the RIE method. After formation of the contact holes 128, a doped polysilicon layer and a conductive layer are deposited and then etched back to form a plug 180 composed of a composite structure of the polysilicon layer and the conductive layer in the contact holes 128.

Here, the plug 180 may be formed not only by an etch-back using the RIE but also other methods including CMP. The plug 180 connects electrically the bit lines 155 in the element isolating region to the N-type diffusion layer 146 in the center of the active region. The conductive layer is composed of a transition metal e.g., tungsten (W) or a silicide of transition metal e.g., tungsten silicide ($WSi_2$).

Figure 4H:
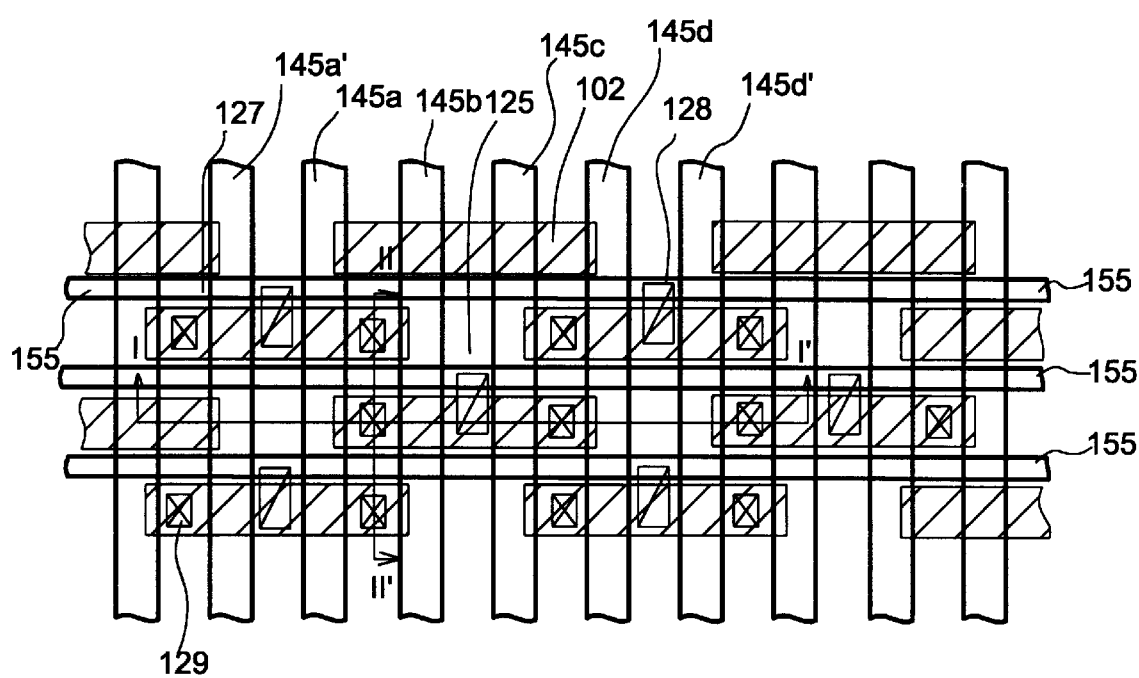
Figure 5H:
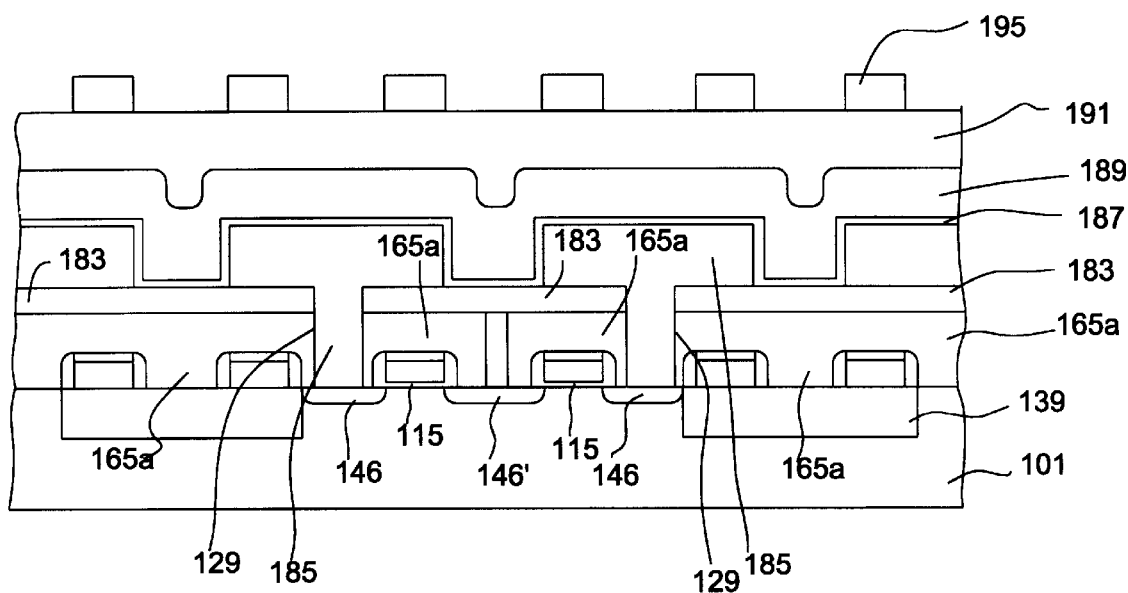
Figure 6H:
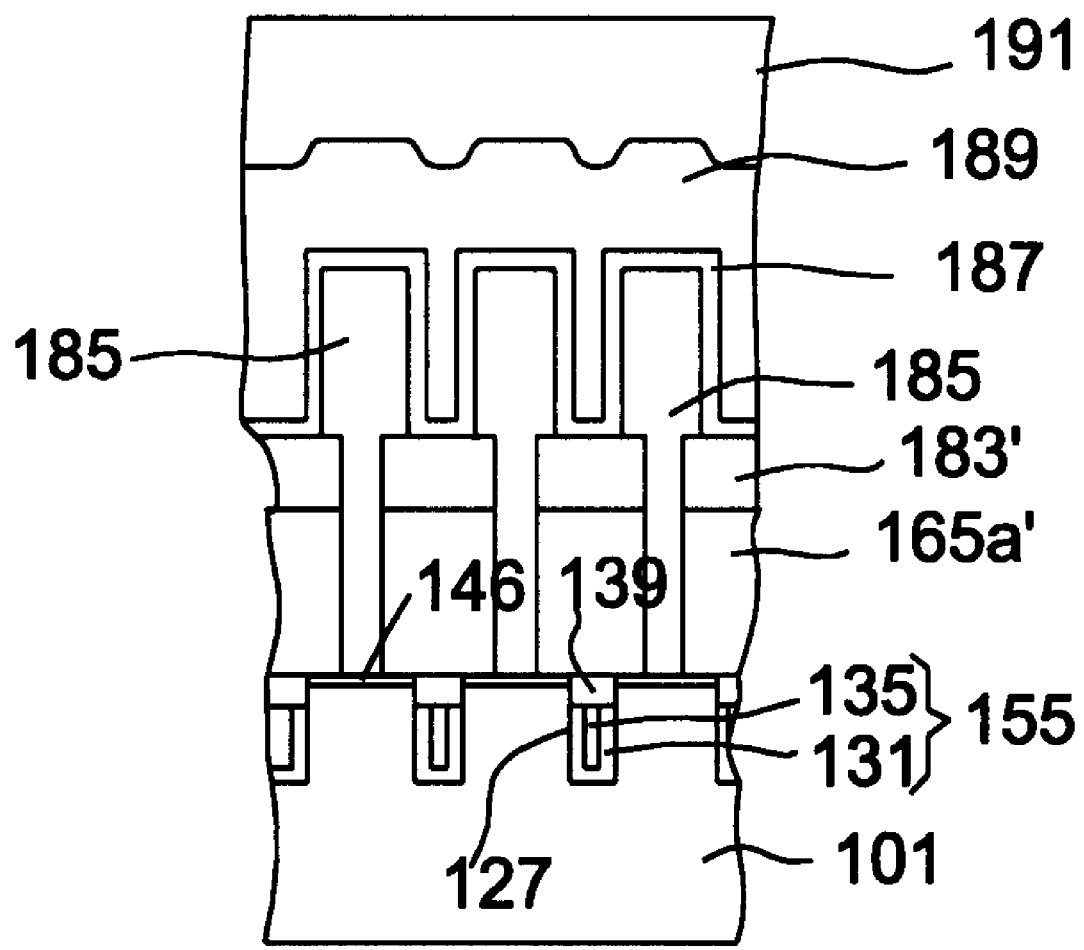

Referring to FIGS. 4H, 5H and 6H, storage node contacts 129 was formed in interlayer insulation layers 183, 165a deposited on the whole surface of the semiconductor substrate 101 by photo-etch method. After the formation of the storage node contacts 129, a storage node electrode 185 is formed of doped polysilicon by the RIE. Thereafter, a dieletric layer such as silicon nitride ($Si_3N_4$) film, or the like was deposited on the surface of a storage node electrode 185. A doped polysilicon is deposited on the surface of a dielectric layer to form a plate electrode 189. Thereafter, an insulation layer 191 and an interconnection layer 195 are formed to complete the manufacturing steps of the memory cell of the DRAM.

Here, the storage node electrode 185 is, not limited to, of a cylindrical shape and the lower electrode may be formed to have different shapes by way of the known manufacturing method. The dielectric layer 187 formed on the surface of the storage node electrode 185 is composed of a silicon nitride ($Si_3N_4$) or silicon oxide ($SiO_2$), or a composite layer of silicon nitride and silicon oxide, or a tantalum oxide ($Ta_2O_5$) or hafnium oxide ($HaO_2$). The interconnection layer 195 serves as a strapping line of the word lines.

As described above, the method for fabricating DRAM cells according to the present invention includes the steps of: forming a trench in a semiconductor substrate using a stacked layer as a mask, the stacked layer composed of a silicon oxide film and a silicon nitride film formed in an active region of the semiconductor substrate; forming a first insulation layer on the bottom and the sides of the trench; depositing a first conductive layer on the entire surface of the semiconductor substrate including the trench; etching back the conductive layer to be recessed from the top surface of the semiconductor substrate and forming bit lines of the first conductive layer on the bottom of the trench in a direction of column; burying a second insulation layer in the trench; removing a part of the stacked layer and the second insulation layer to expose the semiconductor substrate in the active region and planarize the semiconductor substrate at the same time; forming a gate insulation layer on the semiconductor substrate; forming a gate structure of a second conductive layer on the gate insulation layer; forming a spacer of an insulation layer on the sides of the gate structure of the second conductive layer; forming source and drain regions on the sides of the gate structure of the second conductive layer; forming a third insulation layer on the semiconductor substrate; connecting the bit lines and a first one of the source and drain regions with a plug of the third conductive layer formed in a contact hole inside the third insulation layer and the second insulation layer; and forming a capacitor connected to a second one of the source and drain regions.

Accordingly, the present invention has the buried bit lines in the trench, making it easy to secure a process margin in the subsequent process, maintaining a constant width of the bit lines to lower the resistance thereof. Furthermore, the bit lines disposed under the word lines has an advantage over patterning the node contact due to the low step height, with enhanced capacitance of the capacitor.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for fabricating DRAM cells, comprising the steps of:

forming a trench within a semiconductor substrate using a stacked layer as a mask, said stacked layer composed of a silicon oxide film and a silicon nitride film formed in an active region of said semiconductor substrate;

forming a first insulation layer on a bottom and sides of said trench;

depositing a first conductive layer on whole surface of said semiconductor substrate including said trench;

etching back said conductive layer to be recessed from a top surface of said semiconductor substrate and forming bit lines of said first conductive layer on said bottom of said trench in a direction of column;

filling a second insulation layer in said trench;

removing said stacked layer and a part of said second insulation layer to expose said semiconductor substrate in said active region and planarizing said semiconductor substrate simultaneously;

forming a gate insulation layer on said semiconductor substrate;

forming a gate structure of a second conductive layer on said gate insulation layer;

forming a spacer of an insulation layer on said sides of said gate structure of said second conductive layer;

forming source and drain regions on both sides of said gate structure of said second conductive layer;

forming a third insulation layer on said semiconductor substrate;

connecting said bit lines to a first one of said source and drain regions with a plug of a third conductive layer filled in a contact hole inside said third insulation layer and said second insulation layer; and forming a capacitor connected to a second one of said source and drain regions.

2. The method as claimed in claim 1, wherein said first conductive layer is formed of a composite structure of tungsten and polysilicon.

3. The method as claimed in claim 1, wherein said second insulation layer is formed of a CVD (Chemical Vapor Deposition) silicon oxide film.

4. The method as claimed in claim 1, wherein said second conductive layer is formed of a doped polysilicon film.

5. The method as claimed in claim 1, wherein said spacer is formed of a silicon oxide film.

6. The method as claimed in claim 1, wherein said spacer is formed of a silicon nitride film.

7. The method as claimed in claim 1, wherein said spacer is formed of an undoped polysilicon layer.

8. The method as claimed in claim 1, wherein said third insulation layer is formed of a BPSG (Borophosphorosilicate Glass) film.

9. The method as claimed in claim 1, wherein said plug is formed of a composite structure of tungsten and polysilicon.

10. A method for fabricating DRAM cells, comprising the steps of:

forming a trench within a semiconductor substrate using a stacked layer as a mask, said stacked layer composed of a silicon oxide film and a silicon nitride film formed in an active region of said semiconductor substrate;

forming a first insulation layer on a bottom and sides of said trench;

depositing a first conductive layer on whole surface of said semiconductor substrate including said trench;

etching back said conductive layer to be recessed from a top surface of said semiconductor substrate and forming bit lines of said first conductive layer on said bottom of said trench in a direction of column;

filling a second insulation layer in said trench;

removing said stacked layer and a part of said second insulation layer to expose said semiconductor substrate in said active region and planarizing said semiconductor substrate simultaneously;

forming a gate insulation layer on said semiconductor substrate;

forming a gate structure of a second conductive layer on said gate insulation layer;

forming a spacer of an insulation layer on said sides of said gate structure of said second conductive layer;

forming source and drain regions on both sides of said gate structure of said second conductive layer;

forming a third insulation layer on said semiconductor substrate;

connecting said bit lines to a first one of said source and drain regions with a plug of a third conductive layer filled in a contact hole inside said third insulation layer and said second insulation layer;

forming a storage node electrode connected to a second one of said source and drain regions; and forming a plate electrode overlying a dielectric layer disposed said storage node electrode.

* * * * *